United States Patent
Lu et al.

(10) Patent No.: US 11,855,643 B2
(45) Date of Patent: *Dec. 26, 2023

(54) GATED TRI-STATE INVERTER, AND LOW POWER REDUCED AREA PHASE INTERPOLATOR SYSTEM INCLUDING SAME, AND METHOD OF OPERATING SAME

(71) Applicant: TAIWAN SEMICONDUCTOR MANUFACTURING COMPANY, LTD., Hsinchu (TW)

(72) Inventors: Tsung-Che Lu, Hsinchu (TW); Chin-Ming Fu, Hsinchu (TW); Chih-Hsien Chang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/713,125

(22) Filed: Apr. 4, 2022

(65) Prior Publication Data

US 2022/0239288 A1 Jul. 28, 2022

Related U.S. Application Data

(63) Continuation of application No. 17/020,528, filed on Sep. 14, 2020, now Pat. No. 11,296,684.

(Continued)

(51) Int. Cl.
*H03K 5/13* (2014.01)
*H03K 5/135* (2006.01)
(Continued)

(52) U.S. Cl.
CPC ......... *H03K 5/135* (2013.01); *H03K 5/15013* (2013.01); *H03K 2005/00208* (2013.01)

(58) Field of Classification Search
CPC ............... H03K 5/135; H03K 5/15013; H03K 2005/00208
(Continued)

(56) References Cited

U.S. PATENT DOCUMENTS 6,934,215 B2 * 8/2005 Chung ..................... G11C 7/22
                                                      365/194
6,982,578 B2 * 1/2006 Lee ....................... H03L 7/0814
                                                      327/236

(Continued)

FOREIGN PATENT DOCUMENTS

CN 103066999 4/2013
EP 1453203 9/2004

(Continued)

OTHER PUBLICATIONS

Lee, Tsung-Sum, and Chi-Chang Lu. "A 0.6-V subthreshold-leakage suppressed fully differential CMOS switched-capacitor amplifier." Analog Integrated Circuits and Signal Processing 74.2 (2013): 409-416. (pp. 1-8).

(Continued)

*Primary Examiner* — Ryan Jager
(74) *Attorney, Agent, or Firm* — Hauptman Ham, LLP

(57) ABSTRACT

A phase interpolating (PI) system includes: a PI stage configured to receive first and second clock signals and a multi-bit weighting signal, and generate an interpolated clock signal; and an amplifying stage configured to receive and amplify the interpolated clock signal, the amplifying stage including a capacitive component. The capacitive component is tunable to exhibit non-zero capacitances. The capacitive component has a Miller effect configuration resulting in a reduced footprint of the amplifying stage.

19 Claims, 9 Drawing Sheets

US 11,855,643 B2
Page 2

Related U.S. Application Data

(60) Provisional application No. 63/003,035, filed on Mar. 31, 2020.

(51) Int. Cl.
*H03K 5/15* (2006.01)
*H03K 5/00* (2006.01)

(58) Field of Classification Search
USPC .................................................. 327/235, 247
See application file for complete search history.

(56) References Cited

U.S. PATENT DOCUMENTS

| | | | |
|---|---|---|---|
| 7,046,059 B2 | 5/2006 | Kwak | |
| 7,142,026 B2 | 11/2006 | Kwak | |
| 7,274,236 B2 * | 9/2007 | Lee | H03K 5/133 |
| | | | 327/158 |
| 7,282,977 B2 * | 10/2007 | Lee | H03L 7/0812 |
| | | | 327/175 |
| 7,772,899 B2 * | 8/2010 | Choi | H03L 7/0816 |
| | | | 327/158 |
| 7,778,095 B2 * | 8/2010 | Na | G11C 7/22 |
| | | | 365/194 |
| 7,830,186 B2 * | 11/2010 | Yun | H03L 7/0814 |
| | | | 327/158 |
| 8,004,328 B2 * | 8/2011 | Kim | H03L 7/07 |
| | | | 327/158 |
| 8,063,686 B1 | 11/2011 | Naviasky et al. | |
| 8,593,208 B2 | 11/2013 | Kim | |
| 2003/0179027 A1 | 9/2003 | Kizer et al. | |
| 2004/0062121 A1 * | 4/2004 | Chung | G11C 7/22 |
| | | | 365/222 |
| 2010/0079180 A1 * | 4/2010 | Kim | H03L 7/0818 |
| | | | 327/158 |
| 2011/0241746 A1 | 10/2011 | Fu | |
| 2013/0099837 A1 | 4/2013 | Kim | |
| 2020/0127644 A1 | 4/2020 | Yang et al. | |

FOREIGN PATENT DOCUMENTS

| | | |
|---|---|---|
| KR | 20100037427 | 4/2010 |
| KR | 20130043456 | 4/2013 |

OTHER PUBLICATIONS

Office Action dated Apr. 15, 2022 for corresponding case No. KR 10-2020-0178744. (pp. 1-7).

* cited by examiner

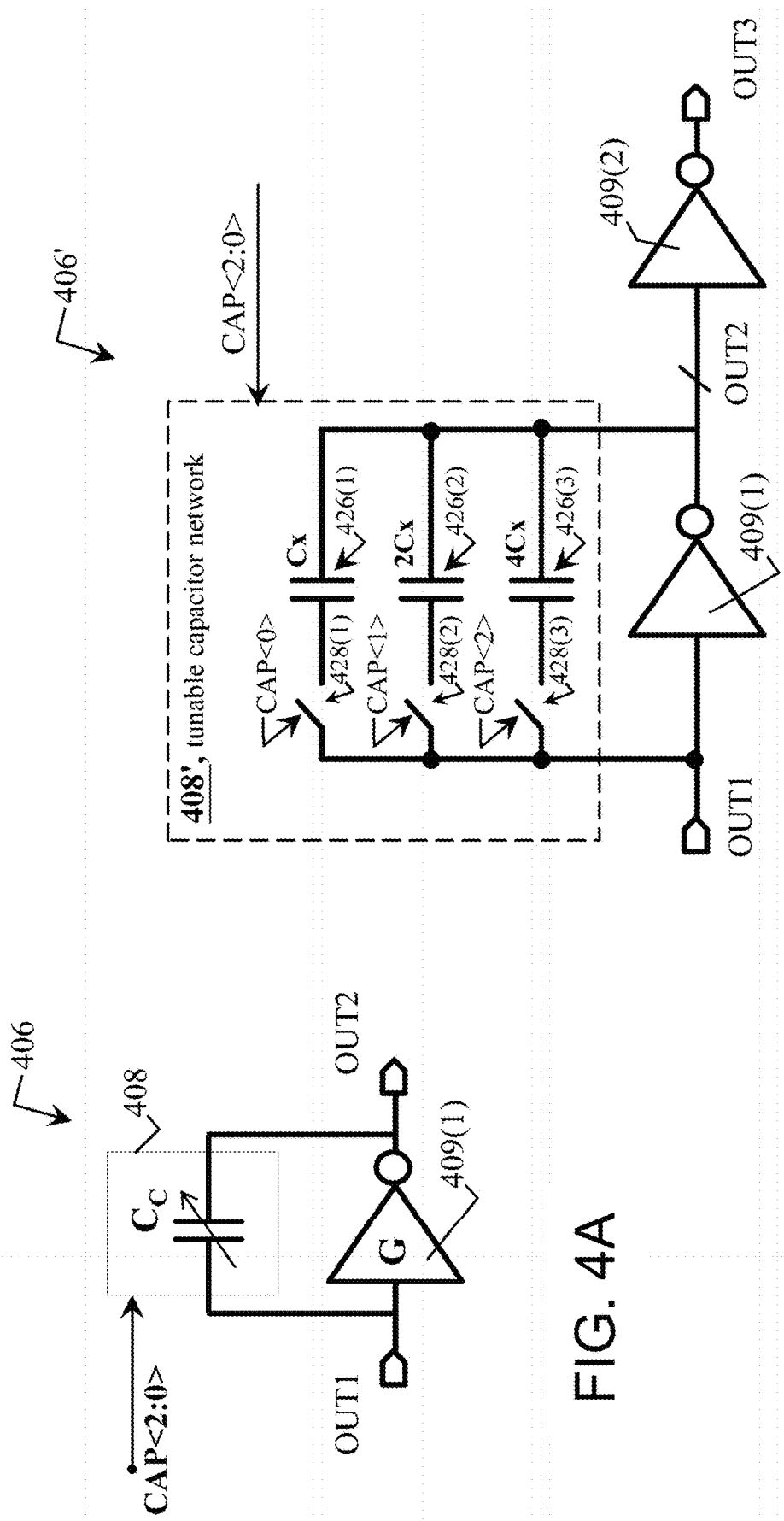

GATED TRI-STATE INVERTER, AND LOW POWER REDUCED AREA PHASE INTERPOLATOR SYSTEM INCLUDING SAME, AND METHOD OF OPERATING SAME

PRIORITY CLAIM

This application is a continuation of U.S. application Ser. No. 17/020,528, filed Sep. 14, 2020, now U.S. Pat. No. 11,296,684, issued Apr. 5, 2022, which claims the priority of U.S. Provisional Application No. 63/003,035, filed Mar. 31, 2020, each of which is incorporated herein by reference in its entirety.

BACKGROUND

In recent years, demand of high-speed memory interfaces has increased due to progressively increasing requirement to transfer large amounts of data using large bandwidth.

In memory interface systems, a phase interpolator generates (interpolates) an intermediate phase clock that is interpolated from (based on) two clocks which have certain phase spacing with respect to each other. In general, a PI facilitates tuning of timing and/or phase alignment.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 3B' is a more-detailed version of FIG. 3B, in accordance with some embodiments.

FIG. 3C' is a more-detailed version of FIG. 3C, in accordance with some embodiments.

FIG. 4A is a circuit diagram of a low-area, tunable capacitive-loading amplifying stage, in accordance with some embodiments.

FIG. 4B is a circuit diagram of a low-area, tunable capacitive-loading amplifying stage, in accordance with some embodiments.

DETAILED DESCRIPTION

Figure 1A:
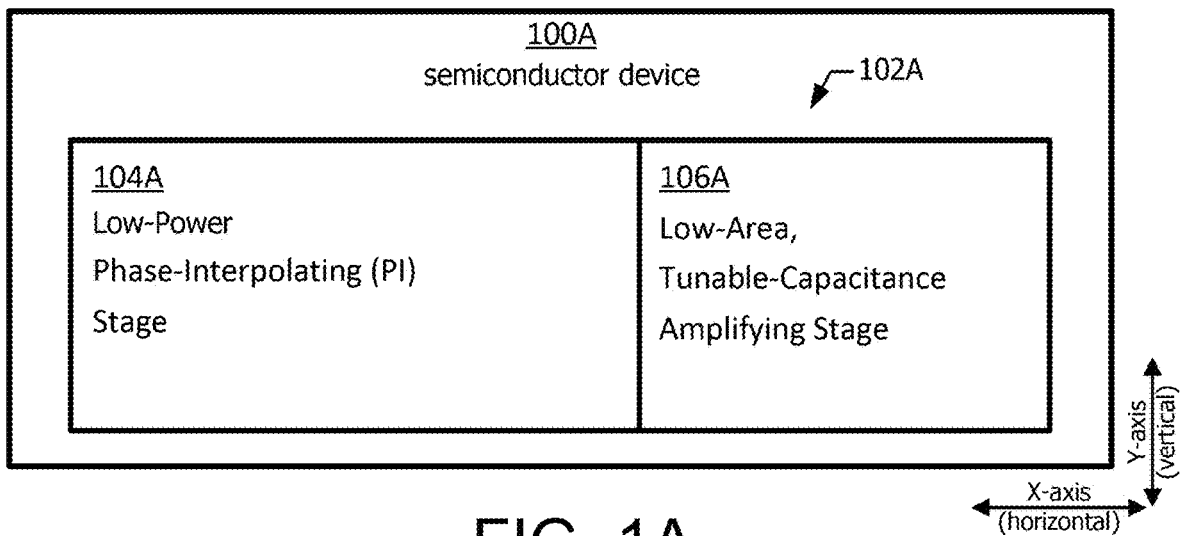
FIGS. 1A, 1B and 1C are corresponding block diagrams of semiconductor devices, in accordance with at least one embodiment of the present disclosure.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a phase interpolating (PI) system includes: a phase-interpolating (PI) stage configured to receive first and second clock signals and a weighting signal, and generate an interpolated clock signal, the PI stage having a low power configuration; and an amplifying stage configured to receive and amplify the interpolated clock signal, the amplifying stage including a tunable capacitive component, the capacitive component having a Miller effect configuration.

According to a first other approach for a PI system, short-circuit currents are suffered which has a disadvantage in that, under certain circumstances, a PI stage thereof suffers a pull-up/pull-down (PUPD) short-circuit situation (discussed below) which increases power consumption and so is referred to as a high power PI stage. According to a second other approach for a PI system, PUPD short-circuits are reduced with the use of discrete combinatorial logic circuitry which, among other things, has a disadvantage of an increased size/footprint and so is referred to as a large footprint PI stage. At least some embodiments provide a PI system which avoids the PUPD short-circuit situation through the use of a low-power PI stage which nevertheless does not suffer and increased size/footprint and so is referred to as small footprint PI stage, and wherein the low power, small footprint PI stage includes: a first cell including parallel connected tri-state (3S) inverters; and a second cell including parallel connected gated tri-state (G3S) inverters. At least some embodiments provide a PI stage which avoids the short-circuit situation because any given 3S inverter, and its corresponding G3S inverter, are reciprocally operated such that: when the given 3S inverter is controlled to be output a logical high signal, the corresponding G3S inverter is controlled to output a logical high signal; and when the given 3S inverter is controlled to be output a logical low signal, the corresponding G3S inverter is controlled to output a logical low signal. Relative to the high power PI stage according to the other approach, PI stage 304 is regarded as low power. At least some embodiments of a PI system achieve a reduced area by using an amplifying stage which includes: an amplifier configured with a feedback loop which capacitively couples an output of the amplifier to an input of the amplifier, thereby exploiting the Miller effect.

Figure 1B:
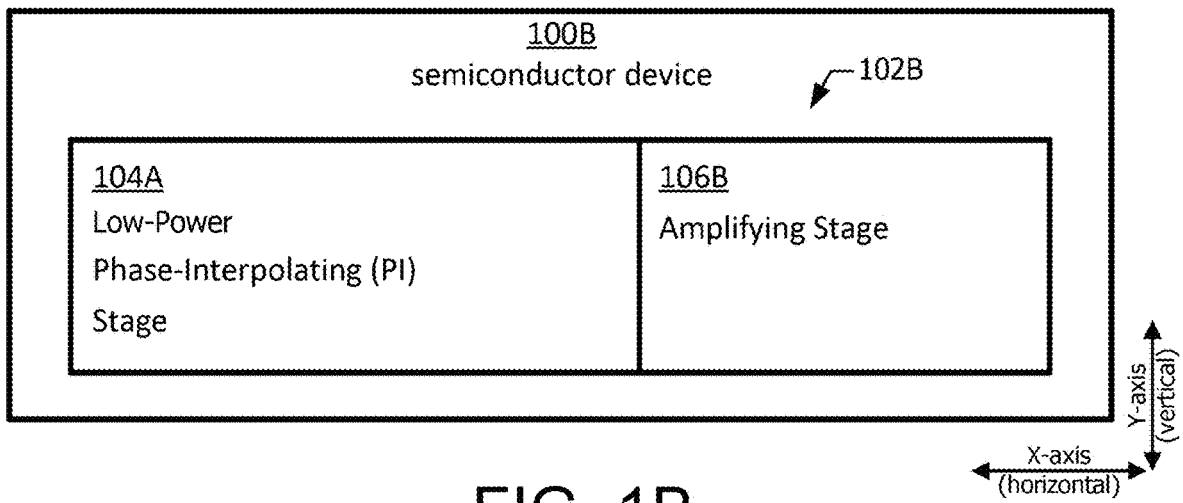
Figure 1C:
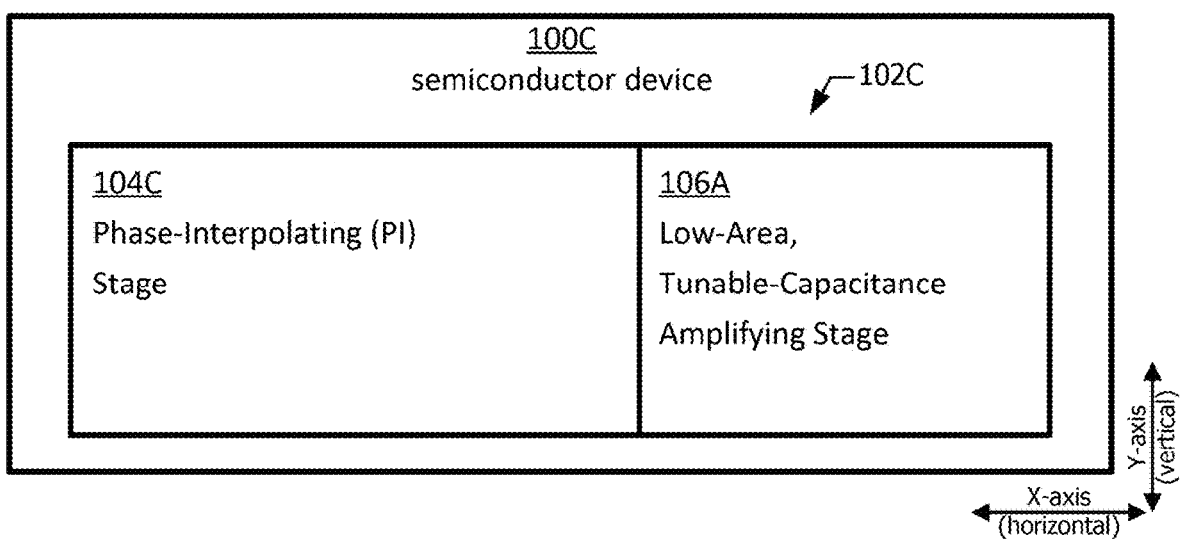

FIGS. 1A, 1B and 1C are corresponding block diagrams of corresponding semiconductor devices 100A, 100B and 100C, in accordance with at least one embodiment of the present disclosure.

In FIG. 1A, semiconductor device 100A includes a Phase-Interpolating (PI) system 102A. PI system 102A includes: a low-power, Phase-Interpolating (PI) stage 104A; and a low-area, tunable-capacitance amplifying stage 106A.

In FIG. 1B, semiconductor device 100B includes a PI system 102B. PI system 102B includes: low-power PI stage 104A; and an amplifying stage 106B. Relative to low-area, tunable-capacitance amplifying stage 106A of FIG. 1A, amplifying stage 106B is not low-area, nor does it have tunable-capacitance.

In FIG. 1C, semiconductor device 100C includes a PI system 102C. PI system 102C includes: a PI stage 104A; and a low-area, tunable-capacitance amplifying stage 106A. Relative to the low-power PI stage 104A of FIG. 1A, PI stage 1044C is not low-power.

Figure 2:
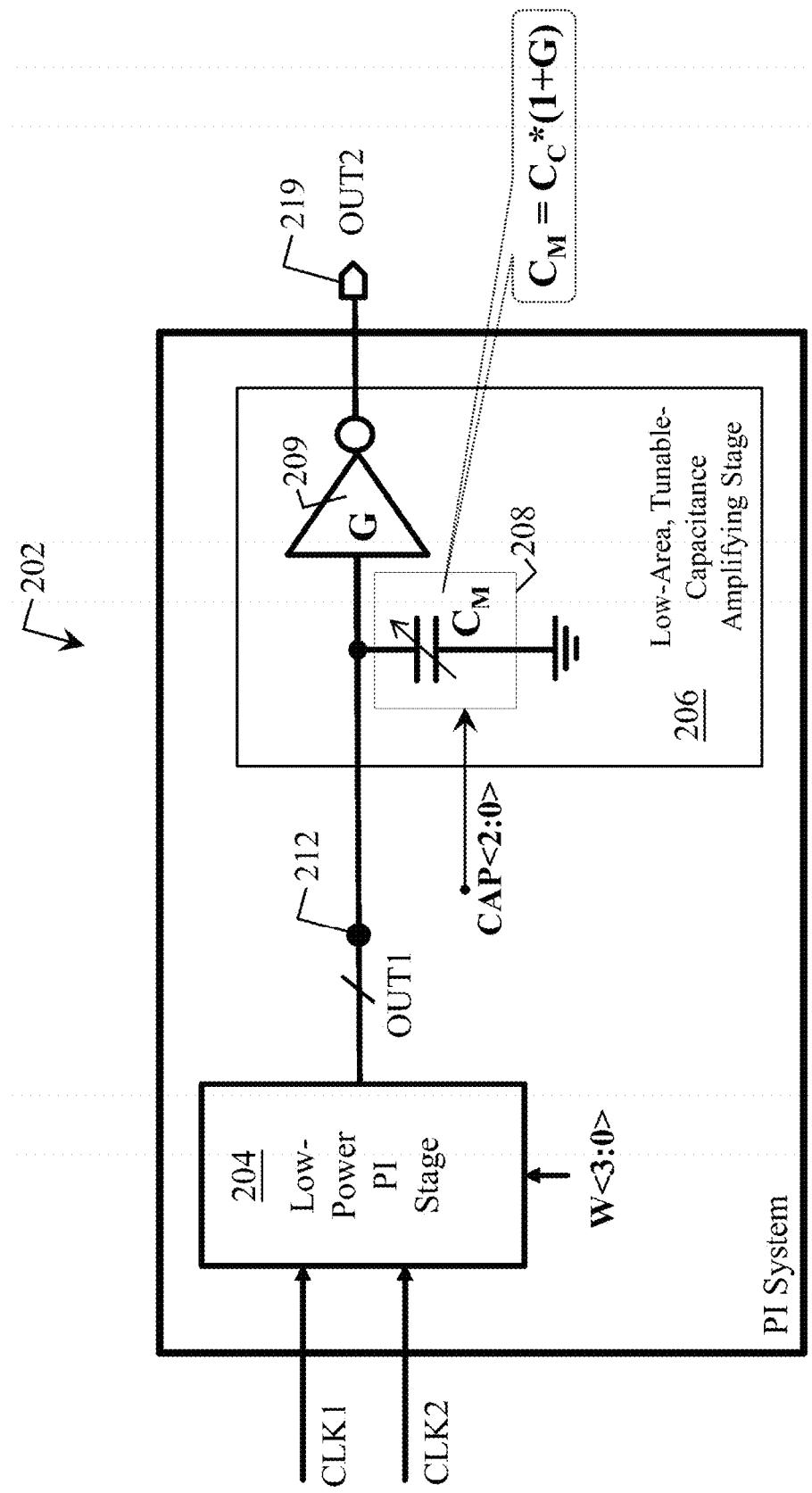
FIG. 2 is a block diagram of a Phase-Interpolating system, in accordance with some embodiments.

FIG. 2 is a block diagram of a Phase-Interpolating (PI) system 202, in accordance with some embodiments.

PI system 202 includes a low-power, Phase-Interpolating (PI) stage 204; and a low-area, tunable-capacitance amplifying stage 206.

PI stage 204 is configured to receive a first clock CLK1, a second clock CLK2 and a multi-bit, binary weighting signal W<(M−1):0>, where M is a positive integer and 2≤M. In FIG. 2, for purposes of facilitating discussion, a value of M is assumed, namely M=4, and so W<(M−1):0> is W<3:1>. In some embodiments, 2≤M and M≠4. PI stage 204 is configured to output a first phase-interpolated signal OUT1 at a node 212. More detail regarding PI stage 204 is provided in the discussion of FIGS. 3A, 3B, 3B', 3C, 3C' and 3D-3F.

Low-area, tunable-capacitance amplifying stage 206 is configured to receive signal OUT1 at node 212, a multi-bit capacitance-tuning signal CAP<(N−1):0>, where N is a positive integer and 2≤N. In FIG. 2, N=3, and so CAP<(N−1):0> is CAP<2:0>. In some embodiments, 2≤N and N≠3. Amplifying stage 206 is configured to output an amplified version of first phase-interpolated signal OUT1 as signal OUT2 at a node 219.

Amplifying stage 206 includes an inverting amplifier 209 and a tunable capacitance 208. Inverting amplifier 209 is an analog device, as contrasted with a logical inverter which is a digital device. Inverting amplifier 209 has a gain, G. Tunable capacitance 208 has a variable capacitance $C_M$ and is shown in a Miller-equivalent configuration in FIG. 2. In the Miller-equivalent configuration, tunable capacitance 208 is shown as coupled between node 212 and a first system reference voltage, which is ground in FIG. 2. In some embodiments, the first system reference voltage is VSS. Tunable capacitance 208 is configured to receive capacitance-tuning signal CAP<(N−1):0>, and thereby adjust the value of variable capacitance $C_M$. More detail regarding amplifying stage 206 is provided by the discussion of FIGS. 4A-4B.

Figure 3A:
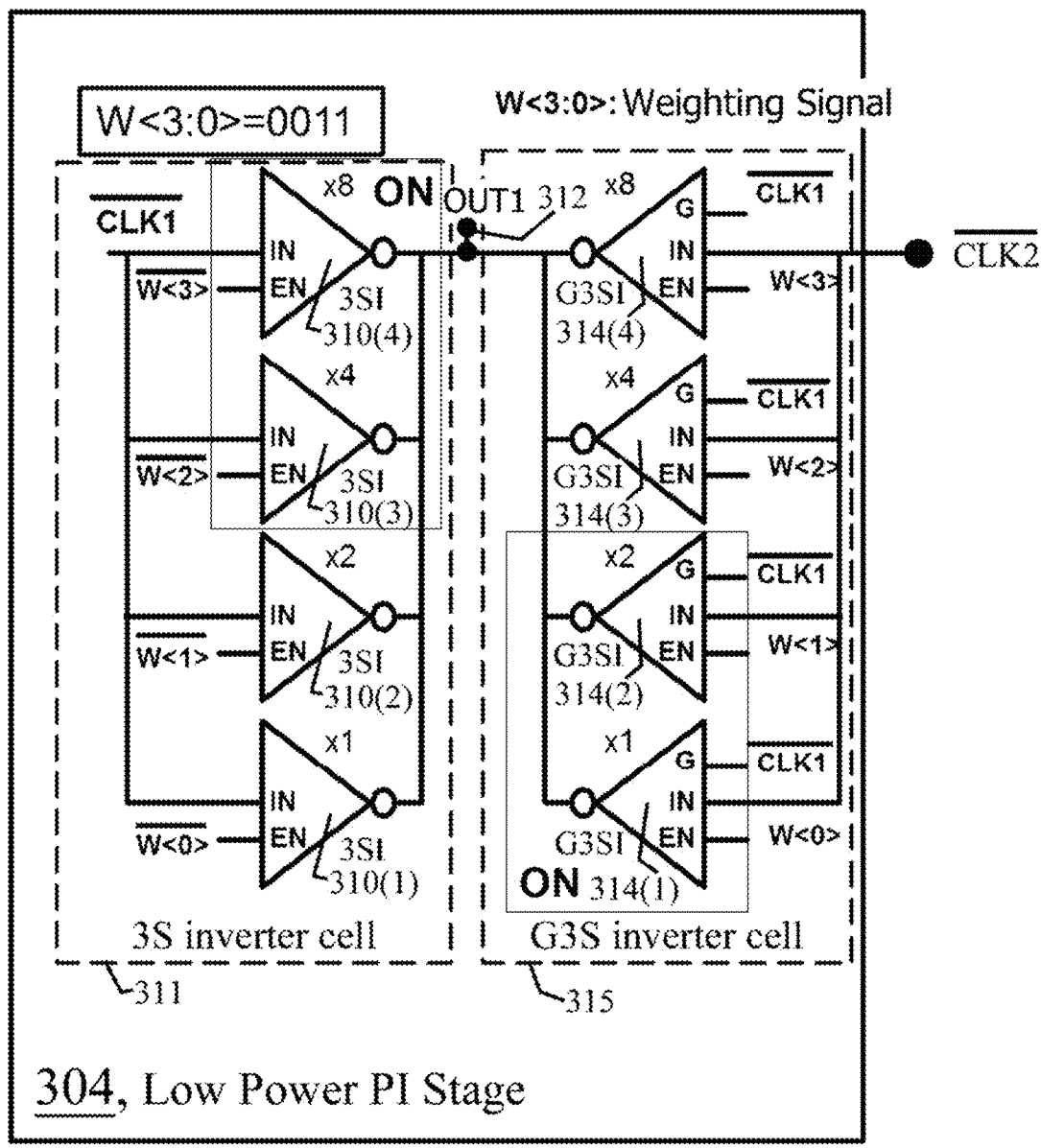
FIG. 3A is a block diagram of low power, Phase-Interpolating stage, in accordance with some embodiments.

FIG. 3A is a block diagram of low power, Phase-Interpolating (PI) stage 304, in accordance with some embodiments.

PI stage 304 includes: tri-state (3S) inverters 310(1), 310(2), 310(3) and 310(4); and gated tri-state (G3S) inverters 314(1), 314(2), 314(3) and 314(4). PI stage 304 is configured to output first phase-interpolated signal OUT1 at a node 312. The 3S inverters 310(1)-310(4) are arranged into a cell 311. G3S inverters 314(1)-314(4) are arranged into a cell 315.

Each one of 3S inverters 310(1)-310(4) includes an input terminal IN, an enable terminal EN and an output terminal. A more detailed view of each of 3S inverters 310(1)-310(4) is provided in FIG. 3C. Input terminal IN of each of 3S inverters 310(1)-310(4) is configured to receive a logical inverse of first clock CLK1 (CLK1_bar). For simplicity of illustration, circuitry to produce CLK1_bar from CLK1 is not shown in FIG. 3A. The output terminal of each of 3S inverters 310(1)-310(4) is coupled to node 312.

In FIG. 3A, for purposes of providing a detailed example of the operation of PI stage 304, a value of multi-bit, binary weighting signal W<3:0> is assumed, namely W<3:0>=0011. In some embodiments, W<3:0> takes various values other than W<3:0>=0011. Also, it should be recalled that W<3:0> itself is an example of the more general multi-bit, binary weighting signal W<(M−1):0>.

Enable terminal EN of 3S inverter 310(1) is configured to receive a logical inverse of a first bit W<0>(W<0>_bar) of multi-bit weighting signal W<3:0>. Enable terminal EN of 3S inverter 310(2) is configured to receive a logical inverse of a second bit W<1>(W<1>_bar) of multi-bit weighting signal W<3:0>. Enable terminal EN of 3S inverter 310(3) is configured to receive a logical inverse of a third bit W<2> (W<2>_bar) of multi-bit weighting signal W<3:0>. Enable terminal EN of 3S inverter 310(4) is configured to receive a logical inverse of a fourth bit W<3>(W<3>_bar) of multi-bit weighting signal W<3:0>. For simplicity of illustration, circuitry to produce W<0>_bar-W<3>_bar correspondingly from W<0>-W<3> is not shown in FIG. 3A.

There is one instance, namely $2^{bit\_position\{W<0>\}}$ instance, of 3S inverter 310(1) included in PI stage 304. A label "x1" is shown proximal to 3S inverter 310(1). As bit_position{W<1>} is zero, there is $2^{bit\_position\{W<0>\}}=2^0=1$ instance of 3S inverter 310(1) in PI stage 304, which represents a corresponding group albeit with one member. There are multiple instances, namely $2^{bit\_position\{W<1>\}}$ instances, of 3S inverter 310(2) included in PI stage 304. As bit_position{W<1>} is one, there is $2^{bit\_position\{W<1>\}}=2^1=2$ instance of 3S inverter 310(2) in PI stage 304, which together represent a corresponding group having multiple members. For simplicity of illustration, only one instance of 3S inverter 310(2) is shown in FIG. 3A. A label "x2" is shown proximal to 3S inverter 310(2). There are multiple instances, namely $2^{bit\_position\{W<2>\}}$ instances, of 3S inverter 310(3) included in PI stage 304. As bit_position{W<2>} is two, there are $2^{bit\_position\{W<2>\}}=2^2=4$ instance of 3S inverter 310(3) in PI stage 304, which together represent a corresponding group having multiple members. For simplicity of illustration, only one instance of 3S inverter 310(3) is shown in FIG. 3A. A label "x4" is shown proximal to 3S inverter 310(3). There are multiple instances, namely $2^{bit\_position\{W<3>\}}$ instances, of 3S inverter 310(4) included in PI stage 304. As bit_position{W<3>} is three, there are $2^{bit\_position\{W<3>\}}=2^3=8$ instance of 3S inverter 310(4) in PI stage 304, which together represent a corresponding group having multiple members. A label "x8" is shown proximal to 3S inverter 310(4). For simplicity of illustration, only one instance of 3S inverter 310(3) is shown in FIG. 3A.

In FIG. 3A, each one of G3S inverters 314(1)-314(4) includes an input terminal IN, an enable terminal EN, a gating terminal G and an output terminal. A more detailed view of each of G3S inverters 314(1)-314(4) is provided in FIG. 3B.

Input terminal IN of each of G3S inverters 314(1)-314(4) is configured to receive a logical inverse of second clock CLK2 (CLK2_bar). For simplicity of illustration, circuitry to produce CLK2_bar from CLK2 is not shown in FIG. 3A. Gating terminal G of each of G3S inverters 314(1)-314(4) is configured to receive CLK1_bar.

Each enable terminal EN of corresponding G3S inverters 314(1)-314(4) is configured to receive a corresponding bit W<i> of multi-bit weighting signal W<3:0>. More particularly, enable terminal EN of G3S inverter 314(1) is configured to receive a first bit W<0> of multi-bit weighting signal W<3:0>. Enable terminal EN of G3S inverter 314(2) is configured to receive a second bit W<1> of multi-bit weighting signal W<3:0>. Enable terminal EN of G3S inverter 314(3) is configured to receive a third bit W<2> of multi-bit weighting signal W<3:0>. Enable terminal EN of G3S inverter 314(4) is configured to receive fourth bit W<3> of multi-bit weighting signal W<3:0>.

There is one instance, namely $2^{bit\_position\{W<0>\}}$ instance, of G3S inverter 314(1) included in PI stage 304. As bit_position{W<1>} is zero, there is $2^{bit\_position\{W<0>\}}=2^0=1$ instance of G3S inverter 314(1) in PI stage 304, which represents a corresponding group albeit with one member. A label "x1" is shown proximal to G3S inverter 314(1). There are multiple instances, namely $2^{bit\_position\{W<1>\}}$ instances, of G3S inverter 314(2) included in PI stage 304. As bit_position{W<1>} is one, there is $2^{bit\_position\{W<1>\}}=2^1=2$ instance of G3S inverter 314(2) in PI stage 304, which together represent a corresponding group having multiple members. For simplicity of illustration, only one instance of G3S inverter 314(2) is shown in FIG. 3A. A label "x2" is shown proximal to G3S inverter 314(2). There are multiple instances, namely $2^{bit\_position\{W<2>\}}$ instances, of G3S inverter 314(3) included in PI stage 304. As bit_position{W<2>} is two, there are $2^{bit\_position\{W<2>\}}=2^2=4$ instance of G3S inverter 314(3) in PI stage 304, which together represent a corresponding group having multiple members. For simplicity of illustration, only one instance of G3S inverter 314(3) is shown in FIG. 3A. A label "x4" is shown proximal to G3S inverter 314(3). There are multiple instances, namely $2^{bit\_position\{W<3>\}}$ instances, of G3S inverter 314(4) included in PI stage 304. As bit_position{W<3>} is three, there are $2^{bit\_position\{W<3>\}}=2^3=8$ instance of G3S inverter 314(4) in PI stage 304, which together represent a corresponding group having multiple members. A label "x8" is shown proximal to G3S inverter 314(4). For simplicity of illustration, only one instance of G3S inverter 314(3) is shown in FIG. 3A.

According to a first other approach, a PI stage otherwise corresponding to PI stage 304 uses first and second groups each of which has only 3S inverters rather than cell 311 of 3S inverters 310(1)-310(4) and cell 315 of G3S inverters 314(1)-314(5) of PI stage 304. According to the first other approach, some combinations of states of CLK1 and CLK2 create circumstances in which one or more of the 3S inverters are controlled to pull the common output node up towards VDD while one or more of the 3S inverters are controlled to pull the common output node down towards VSS, which represents a pull-up/pull-down (PUPD) type of short-circuit (PUPD short-circuit) situation that consumes a large amount of power. Accordingly, the first other approach is described as a high power PI stage. According to a second other approach for a PI system, PUPD short-circuits are reduced by combining the first and second 3S-inverter-only groups of the first other approach with discrete gating circuitry which, among other things, has a disadvantage of an increased size/footprint and so is referred to as a large footprint PI stage. An advantage of PI stage 304 is that it avoids the PUPD short-circuit situation without having to use discrete combinatorial logic circuitry in contrast the second other approach, which is because any given 3S inverter, e.g., 310(1), and its corresponding G3S inverter, e.g., 314(1) are reciprocally operated by (among other signals) corresponding weighting signals W<0>_bar and W<0>.

Such that: when 3S inverter 310(1) is controlled to output a logical high signal, corresponding G3S inverter 314(1) is controlled to output a logical high signal; and when 3S inverter 310(1) is controlled to output a logical low signal, corresponding G3S inverter 314(1) is controlled to output a logical low signal. Relative to the high power PI stage according to the other approach, PI stage 304 is regarded as low power.

Figure 3B:
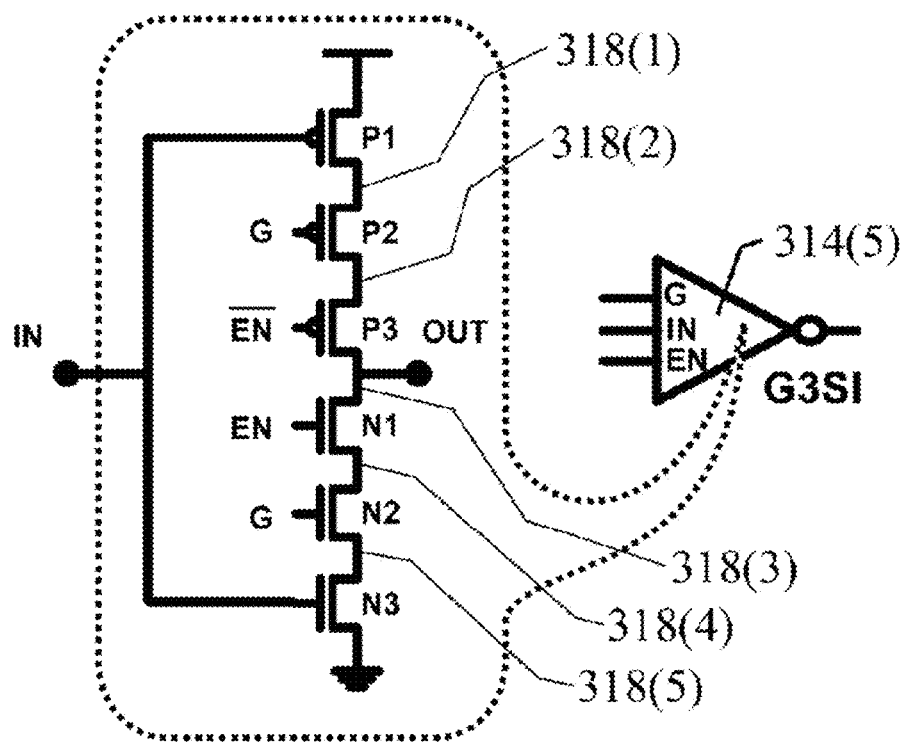
FIG. 3B is a circuit diagram of a gated tri-state (G3S) inverter, in accordance with some embodiments.

FIG. 3B is a circuit diagram of a gated tri-state (G3S) inverter 314(5), in accordance with some embodiments.

FIG. 3B' is a more-detailed version 314(5)' of G3S inverter 314(5) of FIG. 3B, in accordance with some embodiments.

G3S inverter 314(5) in FIG. 3B is an example of each of G3S inverters 314(1)-314(4) of FIG. 3A. G3S inverter 314(5) has applications other than its inclusion in PI stage 304. Accordingly, FIG. 3B shows G3S inverter 314(5) as a separate device and so does not introduce the signal-coupling of PI stage 304. By contrast, FIG. 3B' shows G3S inverter 314(5)' in the context of the signal-coupling of PI stage 304.

G3S inverter 314(5) includes transistors P1, P2, P3, N1, N2 and N3 serially coupled (or daisy-chained) between a second system reference voltage, which is VDD in FIG. 3B (and also in FIGS. 3B', 3C and 3C'), and VSS. In some embodiments, the second system reference voltage is a different voltage than VSS other than VDD. In some embodiments, each of transistors P1-P3 is a PMOS transistor. In some embodiments, each of transistors N1-N3 is an NMOS transistor.

In FIG. 3B, transistor P1 is coupled between VDD and a node 318(1). Transistor P2 is coupled between node 318(1) and a node 318(2). Transistor P3 is coupled between node 318(2) and a node 318(3). Transistor N1 is coupled between node 318(3) and a node 318(4). Transistor N2 is coupled between node 318(4) and a node 318(5). Transistor N3 is coupled between node 318(5) and VSS.

A gate terminal of each of transistors P1 and N3 is configured to receive an input signal on the input terminal IN of G3S inverter 314(5). As such, the gate terminal of transistor P1 is coupled to the gate terminal of transistor N3. A gate terminal of each of transistors P2 and N2 is configured to receive a gating signal on the gating terminal G of G3S inverter 314(5). As such, the gate terminal of transistor P2 is coupled to the gate terminal of transistor N2. An example of a difference between FIG. 3B' and FIG. 3B is that FIG. 3B' shows a signal line which couples the gate terminals of transistors P2 and N2.

A gate terminal of transistor N1 is configured to receive an enable signal on the enable terminal EN of G3S inverter 314(5). A gate terminal of transistor P3 is configured to receive a logical inverse of the enable signal (enable_bar signal) on the enable terminal EN of G3S inverter 314(5).

Again, FIG. 3B' shows G3S inverter 314(5)' in the context of the signal-coupling of PI stage 304. Accordingly, in FIG. 3B', the following is shown: node 318(3) is the same as node 312 in FIG. 3A; the input signal on the gate terminal of each of transistors P1 and N3 is CLK2_bar; the gating signal on the gate terminal of each of transistors P2 and N2 is CLK1_bar; the enable signal on the gate terminal of transistor N1 is corresponding bit W<i> of multi-bit weighting signal W<3:0>; and the enable_bar signal on the gate terminal of transistor P3 is a logical inverse of corresponding bit W<i>(W<i>_bar) of multi-bit weighting signal W<3:0>.

The operation of G3S inverter 314(5)' of FIG. 3B' is further described by the following Truth Tables 1-5.

In Truth Table 1 (below), the enable (E) signal has a logical low state (logical zero), where E=0=W<i>. Accordingly, each of transistors P3 and N1 is turned off, thereby present a high impedance (high Z) to node 318(3) in FIG. 3B' (which, again, is the same as node 312 in FIG. 3A). When E=0=W<i>, the logical states of the input signal CLK2_bar and the gating signal CLK1_bar do not substantially affect the state of the signal on node 318(3). As such, in Truth Table 1, the logical states of the input signal CLK2_bar and the gating signal CLK1_bar are labeled "don't care" (dc).

| Truth Table 1 | | | | |
|---|---|---|---|---|
| CLK2 = dc | CLK1 = dc | | | |
| CLK2_bar = dc | CLK1_bar = dc | | | |
| IN = dc | G = dc | E = 0 | | OUT |
| P1 | don't care (dc) | | | |
| P2 | | don't care | | |
| P3 | | | OFF | |
| N1 | | | OFF | |
| N2 | | don't care | | |
| N3 | don't care | | | |
| OUT | | | | Z |

In each of Truth Tables 2-5 (below), the enable (E) signal has a logical high state (logical one), where E=1=W<i>. Accordingly, each of transistors P3 and N1 is turned on. When E=1=W<i>, the state of the signal on node 318(3) is controlled by the states of the input signal CLK2_bar and the gating signal CLK1_bar.

In Truth Table 2 (below), the input signal CLK2_bar has a logical low state such that IN=CLK2_bar=0, and the gating signal CLK1_bar has a logical high state such that G=CLK1_bar=1. When IN=CLK2_bar=0, transistor P1 is turned on and transistor N3 is turned off. When G=CLK1_bar=1, transistor P2 is turned off and transistor N2 is turned on. As a result of each of transistors P2 and N3 being turned off, a high impedance (high Z) is presented to node 318(3)/312 in FIG. 3B'.

| Truth Table 2 | | | | |
|---|---|---|---|---|
| CLK2 = 1 | CLK1 = 0 | | | |
| CLK2_bar = 0 | CLK1_bar = 1 | | | |
| IN = 0 | G = 1 | E = 1 | | OUT |
| P1 | ON | | | |
| P2 | | OFF | | |
| P3 | | | ON | |
| N1 | | | ON | |
| N2 | | ON | | |
| N3 | OFF | | | |
| OUT | | | | Z |

In Truth Table 3 (below), the input signal CLK2_bar has a logical high state such that IN=CLK2_bar=1, and the gating signal CLK1_bar has a logical low state such that G=CLK1_bar=0. When IN=CLK2_bar=1, transistor P1 is turned off and transistor N3 is turned ON. When G=CLK1_bar=0, transistor P2 is turned on and transistor N2 is turned off. As a result of each of transistors P1 and N2 being turned off, a high impedance (high Z) is presented to node 318(3)/312 in FIG. 3B'.

| Truth Table 3 | | | | |
|---|---|---|---|---|
| CLK2 = 0 | CLK1 = 1 | | | |
| CLK2_bar = 1 | CLK1_bar = 0 | | | |
| IN = 1 | G = 0 | E = 1 | | OUT |
| P1 | OFF | | | |
| P2 | | ON | | |
| P3 | | | ON | |
| N1 | | | ON | |
| N2 | | OFF | | |
| N3 | ON | | | |
| OUT | | | | Z |

In Truth Table 4 (below), the input signal CLK2_bar has a logical low state such that IN=CLK2_bar=0, and the gating signal CLK1_bar has a logical low state such that G=CLK1_bar=0. When IN=CLK2_bar=0, transistor P1 is turned on and transistor N3 is turned off. When G=CLK1_bar=0, transistor P2 is turned on and transistor N2 is turned off. As a result of each of transistors P1 and P2 being turned on, and each of transistors N2 and N3 being turned off, node 318(3)/312 in FIG. 3B' is pulled up to a logical high state.

| Truth Table 4 | | | | |
|---|---|---|---|---|
| CLK2 = 1 | CLK1 = 1 | | | |
| CLK2_bar = 0 | CLK1_bar = 0 | | | |
| IN = 0 | G = 0 | E = 1 | | OUT |
| P1 | ON | | | |
| P2 | | ON | | |
| P3 | | | ON | |
| N1 | | | ON | |
| N2 | | OFF | | |
| N3 | OFF | | | |
| OUT | | | | 1 |

In Truth Table 5 (below), the input signal CLK2_bar has a logical high state such that IN=CLK2_bar=1, and the gating signal CLK1_bar has a logical high state such that G=CLK1_bar=1. When IN=CLK2_bar=1, transistor P1 is turned off and transistor N3 is turned on. When G=CLK1_bar=1, transistor P2 is turned off and transistor N2 is turned on. As a result of each of transistors P1 and P2 being turned off, and each of transistors N2 and N3 being turned on, node 318(3)/312 in FIG. 3B' is pulled down to a logical low state.

| Truth Table 5 | | | | |
|---|---|---|---|---|
| CLK2 = 0 | CLK1 = 0 | | | |
| CLK2_bar = 1 | CLK1_bar = 1 | | | |
| IN = 1 | G = 1 | E = 1 | | OUT |
| P1 | OFF | | | |
| P2 | | OFF | | |
| P3 | | | ON | |
| N1 | | | ON | |
| N2 | | ON | | |
| N3 | ON | | | |
| OUT | | | | 0 |

Figure 3C:
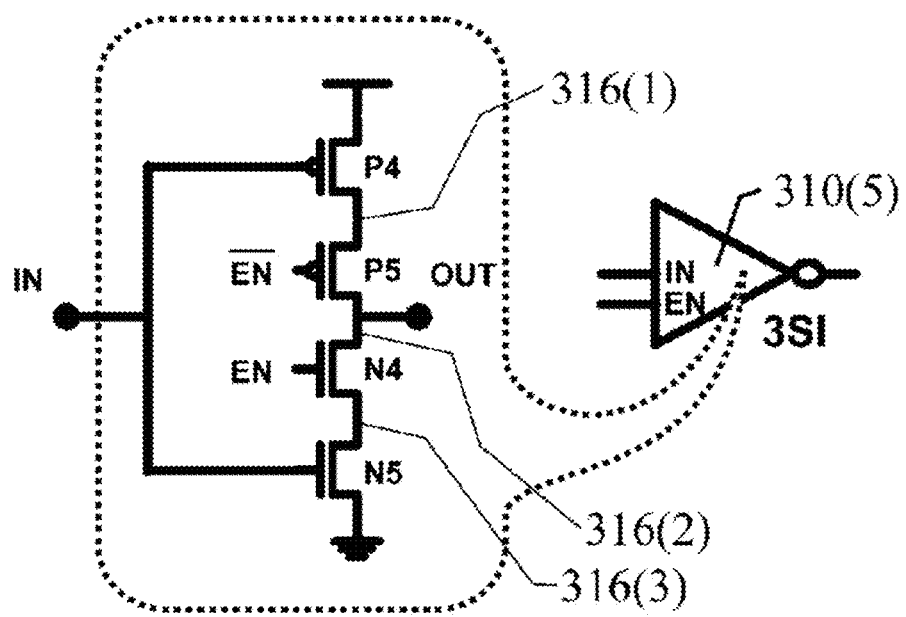
FIG. 3C is a circuit diagram of a tri-state (3S) inverter, in accordance with some embodiments.
Figure 3B:
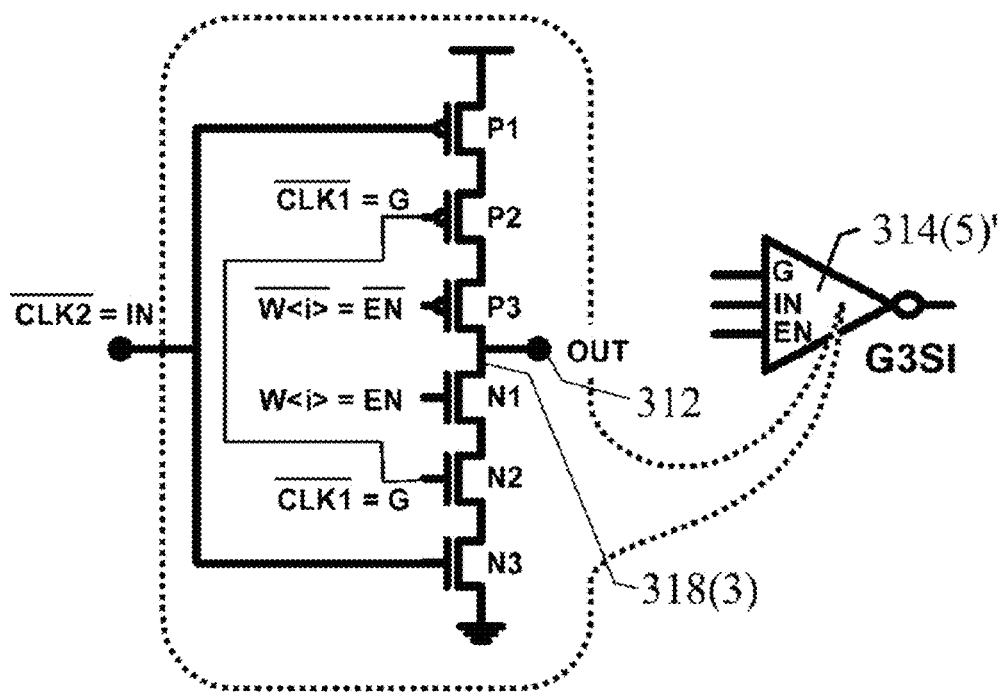
Figure 3C:
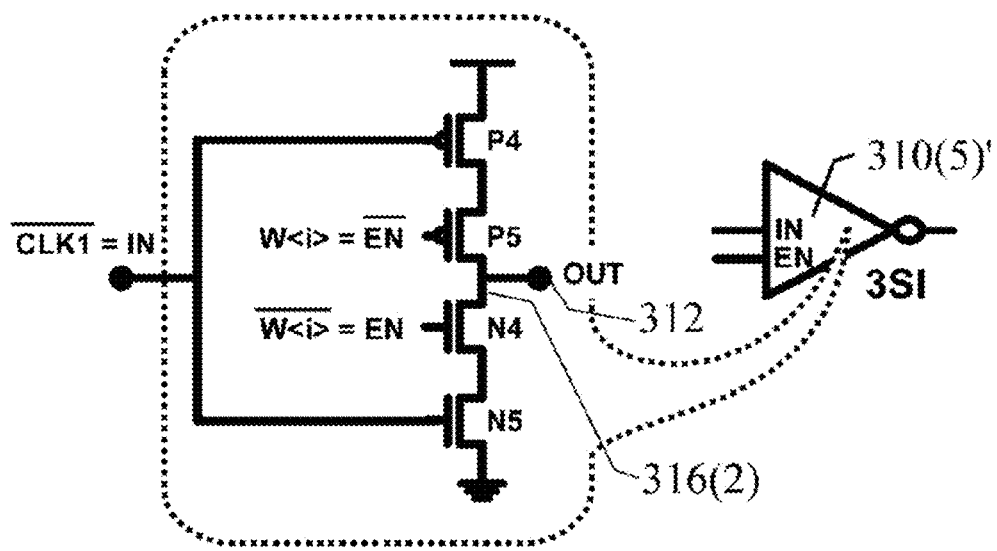

FIG. 3C is a circuit diagram of a tri-state (3S) inverter 310(5), in accordance with some embodiments.

FIG. 3C' is a more-detailed version 310(5)' of 3S inverter 310(5) of FIG. 3C, in accordance with some embodiments.

The 3S inverter 310(5) in FIG. 3C is an example of each of 3S inverters 310(1)-310(4) of FIG. 3A. The 3S inverter 310(5) has applications other than its inclusion in PI stage 304. Accordingly, FIG. 3C shows 3S inverter 310(5) as a separate device and so does not introduce the signal-coupling of PI stage 304. By contrast, FIG. 3C' shows 3S inverter 310(5)' in the context of the signal-coupling of PI stage 304.

The 3S inverter 310(5) includes transistors P4, P5, N4 and N5 serially coupled (or daisy-chained) between VDD and VSS. In some embodiments, each of transistors P4-P5 is a PMOS transistor. In some embodiments, each of transistors N4-N5 is an NMOS transistor.

In FIG. 3C, transistor P4 is coupled between VDD and a node 316(1). Transistor P5 is coupled between node 316(1) and a node 316(2). Transistor N4 is coupled between node 316(2) and a node 316(3). Transistor N5 is coupled between node 316(3) and VSS.

A gate terminal of each of transistors P4 and N5 is configured to receive an input signal on the input terminal IN of 3S inverter 310(5). As such, the gate terminal of transistor P4 is coupled to the gate terminal of transistor N5. A gate terminal of transistor N4 is configured to receive an enable signal on the enable terminal EN of 3S inverter 310(5). A gate terminal of transistor P5 is configured to receive a logical inverse of the enable signal (enable_bar signal) on the enable terminal EN of 3S inverter 310(5).

Again, FIG. 3C' shows 3S inverter 310(5)' in the context of the signal-coupling of PI stage 304. Accordingly, in FIG. 3C', the following is shown: node 316(2) is the same as node 312 in FIG. 3A; the input signal on the gate terminal of each of transistors P4 and N5 is CLK1_bar; the enable_bar signal on the gate terminal of transistor P5 is corresponding bit W<i> of multi-bit weighting signal W<3:0>; and the enable signal on the gate terminal of transistor N4 is W<i>_bar, which (again) is the logical inverse of corresponding bit W<i> ( ) of multi-bit weighting signal W<3:0>.

Figure 3D:
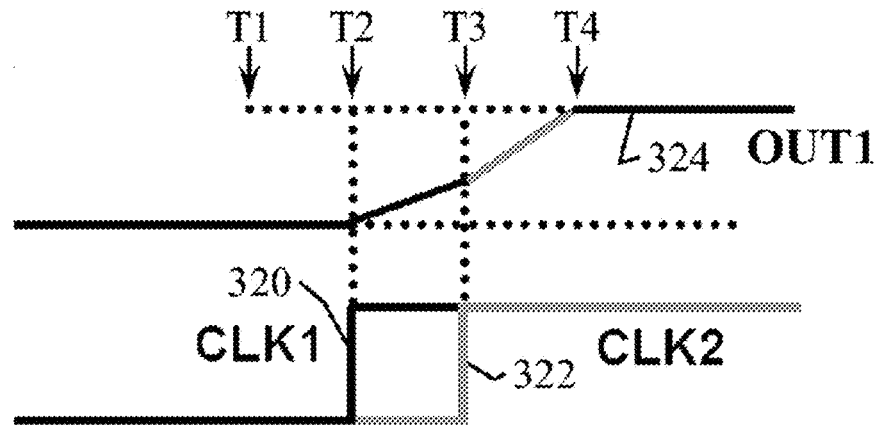
FIG. 3D is a graph of various waveforms, in accordance with some embodiments.

FIG. 3D is a graph of various waveforms related to the operation of PI stage 304, in accordance with some embodiments.

Figure 3E:
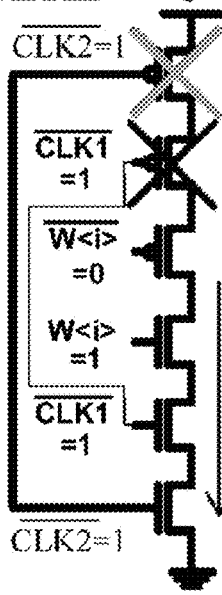
FIGS. 3E, 3F and 3G are corresponding transistor-state circuit diagrams, in accordance with some embodiments.
Figure 3F:
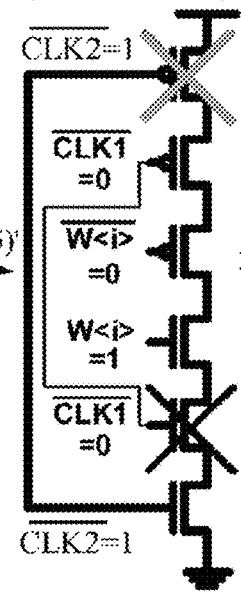
Figure 3G:
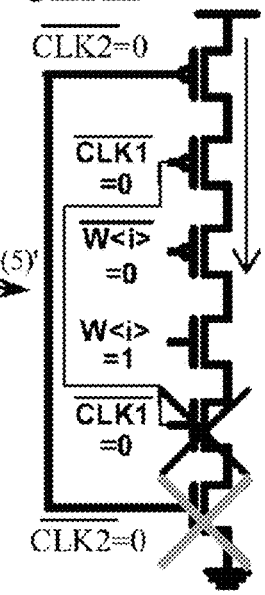

FIGS. 3E, 3F and 3G are corresponding transistor-state circuit diagrams which relate G3S inverter 314(5)' of FIG. 3B' and 3S inverter 310(5)' of FIG. 3C' to the waveforms of FIG. 3D, in accordance with some embodiments.

FIG. 3D includes: a waveform 320 representing CLK1 of FIG. 3A; a waveform 322 representing CLK2 of FIG. 3A; and a waveform 324 representing OUT1 of FIG. 3A. FIG. 3D includes points in time T1, T2, T3 and T4.

In each of FIGS. 3E-3F, the enable (E) signal has a logical high state (logical one), where E=1=W<i>. Accordingly, each of transistors P3 and N1 is turned on. When E=1=W<i>, the operation of G3S 314(5)' is controlled by the states of the input signal CLK2_bar and the gating signal CLK1_bar, and the operation of 3S inverter 310(5)' is controlled by the state of the input signal CLK1_bar.

FIG. 3E corresponds to time T1 in FIG. 3D, and to Truth Table 5 (above). Regarding 3S inverter 310(5)' in FIG. 3E, when the input signal CLK1_bar=1, transistor P4 is turned off and transistor N5 is turned on. As a result, transistors N4 and N5 pull node 316(2)/312 down to a logical low state so that waveform 324 of signal OUT1 has a logical low value in FIG. 3D at time T1.

FIG. 3F corresponds to time T2 in FIG. 3D. FIG. 3F also corresponds to Truth Table 3 (above) so that G3S inverter 314(5)' presents a high impedance (high Z) to node 318(3)/312 in FIG. 3B'. Regarding 3S inverter 310(5)' in FIG. 3F, when the input signal CLK1_bar=0, transistor P4 is turned on and transistor N5 is turned off. As a result, transistors P4 and P5 pull node 316(2)/312 up towards VDD so that waveform 324 of signal OUT1 in FIG. 3D has a value that rises from VSS after time T2 to a value approximately midway between VSS and VDD at time T3.

FIG. 3G corresponds to time T3 in FIG. 3D., FIG. 3G also corresponds to Truth Table 4 (above) so that G3S inverter 314(5)' pulls node 318(3)/312 up towards VDD. Regarding 3S inverter 310(5)' in FIG. 3G, when the input signal CLK1_bar=0, transistor P4 is turned on and transistor N5 is turned off. As a result, transistors P4 and P5 pull node 316(2)/312 up towards VDD so that waveform 324 of signal OUT1 in FIG. 3D has a value that rises from a value approximately midway between VSS and VDD at time T3 to approximately VDD at time T4. In some embodiments, a maximum value of signal OUT1 is VDD.

FIG. 4A is a circuit diagram of a low-area, tunable capacitive-loading amplifying stage 406, in accordance with some embodiments.

Amplifying stage 406 corresponds to amplifying stage 206 of FIG. 2. Amplifying stage 406 includes an inverting amplifier 409(1) and a tunable capacitance 408. Inverting amplifier 409(1) is an analog inverting amplifier that has a gain G and that corresponds to inverting amplifier 209. Tunable capacitance 408 has a variable capacitance $C_C$ and corresponds to tunable capacitance 208 of FIG. 2. Tunable capacitance 408 is configured to receive capacitance-tuning signal CAP<(N−1):0>, and thereby adjust the value of variable capacitance $C_C$.

Tunable capacitance 408 is arranged in a feedback loop and so is coupled between an output and an input of inverting amplifier 409(1). For a given capacitor which has a first capacitance when measured as a discrete element, when the given capacitor is included in a circuit and more particularly is arranged in feedback loop of an inverting amplifier such tunable capacitance 408 in FIG. 4A, the given capacitor interacts with internal capacitances (not shown) of the inverting amplifier so as to behave in the circuit as if the given capacitor has a larger second capacitance. This behavior is referred to as the Miller effect, and the effective larger second capacitance is referred to as the Miller capacitance, $C_M$. In particular, $C_M=C_C(1+G)$. Recalling that tunable capacitance 408 of FIG. 4A corresponds to tunable capacitance 208 of FIG. 2, the depiction of tunable capacitance 208 in FIG. 2 uses the Miller-equivalent configuration to represent the feedback arrangement of tunable capacitance 408 in FIG. 4A.

According to another approach, an amplifying stage otherwise corresponding to amplifying stage 406 does not use a capacitive element in a feedback loop of an inverting amplifier. Compared to the other approach, an advantage of amplifying stage 406 is a reduced size of tunable capacitance 408 that is achieved by the Miller effect of the feedback loop, wherein the corresponding footprint of amplifying stage 406 is reduced.

FIG. 4B is a circuit diagram of a low-area, tunable capacitive-loading amplifying stage 406', in accordance with some embodiments.

Amplifying stage 406' of FIG. 4B corresponds to amplifying stage 406 of FIG. 4A. Tunable capacitance 408 of FIG. 4A is shown as tunable capacitor network 408' in FIG. 4B. Coupled in parallel between the input and the output of inverting amplifier 409(2), tunable capacitor network 408' includes: a series-coupling of a switch 428(1) and a capacitor 416(1); a series-coupling of a switch 428(2) and a capacitor 416(2); and a series-coupling of a switch 428(3) and a capacitor 416(3).

In FIG. 4B, capacitor 426(1) has a capacitance of Cx, where Cx represents a unit of capacitance. Capacitor 426(2) has a capacitance of 2*Cx. Capacitor 426(3) has a capacitance of 4*Cx. In some embodiments, the values of capacitors 426(1)-426(3) are various combinations of values other than the corresponding ratio of 1:2:4.

Each of switches 428(1)-428(3) is configured to receive a corresponding bit CAP<i> of multi-bit capacitance-tuning signal CAP<2:0>. More particularly, switch 428(1) is configured to receive a first bit CAP<0> of CAP<2:0>. Switch 428(2) is configured to receive a second bit CAP<1> of CAP<2:0>. Switch 428(3) is configured to receive a third bit CAP<2> of CAP<2:0>. Accordingly, CAP<2:0> is used to selectively connect one of more of capacitors 426(1)-426(3) between the input and the output of inverting amplifier 409(2), and thereby adjust the total capacitance between the input and the output of inverting amplifier 409(2).

As compared to amplifying stage 406 of FIG. 4A, amplifying stage 406' further includes an analog inverting amplifier 409(2). The input of inverting amplifier 409(2) is coupled to the output of inverting amplifier 409(1) and so is configured to receive signal OUT2. The output of inverting amplifier 409(2) is configured to provide a signal OUTS.

Figure 5:
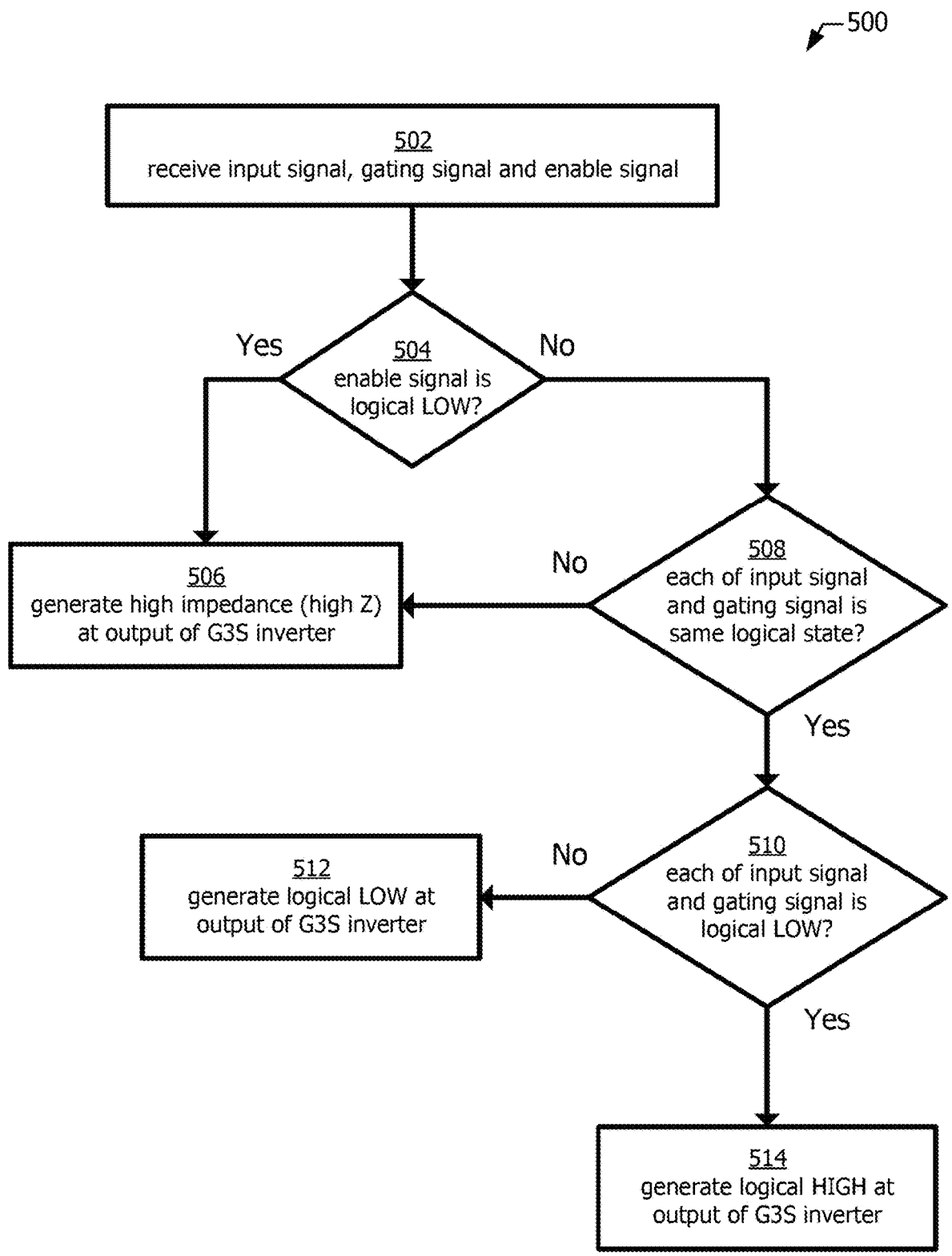
FIG. 5 is a flowchart of a method of operating a gated tri-state inverter, in accordance with some embodiments.

FIG. 5 is a flowchart of a method 500 of operating a gated tri-state (G3S) inverter, in accordance with some embodiments.

Method 500 includes blocks 502-514. At block 4502, an input signal, a gating signal and an enable signal are received by the G3S inverter. An example of the G3S inverter is G3S inverter 314(5) of FIG. 3B. From block 502, flow proceeds to block 504.

At block 504, a decision is made whether the enable signal has a logical low value. If the answer at decision block 504 is yes, then flow proceeds to block 506. At block 506, a high impedance (high Z) is generated at the output of the G3S inverter. An example of a high impedance (high Z) being generated at the output of the G3S inverter is the context of Truth Table 1. If, however, the answer at decision block 504 is no, then flow proceeds to block 508.

At block 508, a decision is made whether each of the input signal and the gating signal has the same logical state. If the answer at decision block 508 is no, then flow proceeds to block 506. Examples of the input signal and the gating signal not having the same logical state are the context of Truth Table 2 and the context of Truth Table 3. If, however, the answer at decision block 508 is yes, then flow proceeds to block 508.

At block 510, a decision is made whether each of the input signal and the gating signal has a logical low state. If the answer at decision block 510 is no, then flow proceeds to block 512. At block 512, a logical low state is generated at the output of the G3S inverter. An example a logical low state being generated at the output of the G3S inverter is the context of Truth Table 5. If, however, the answer at decision block 510 is yes, then flow proceeds to block 514. At block 514, a logical high state is generated at the output of the G3S inverter. An example a logical high state being generated at the output of the G3S inverter is the context of Truth Table 4.

Figure 6:
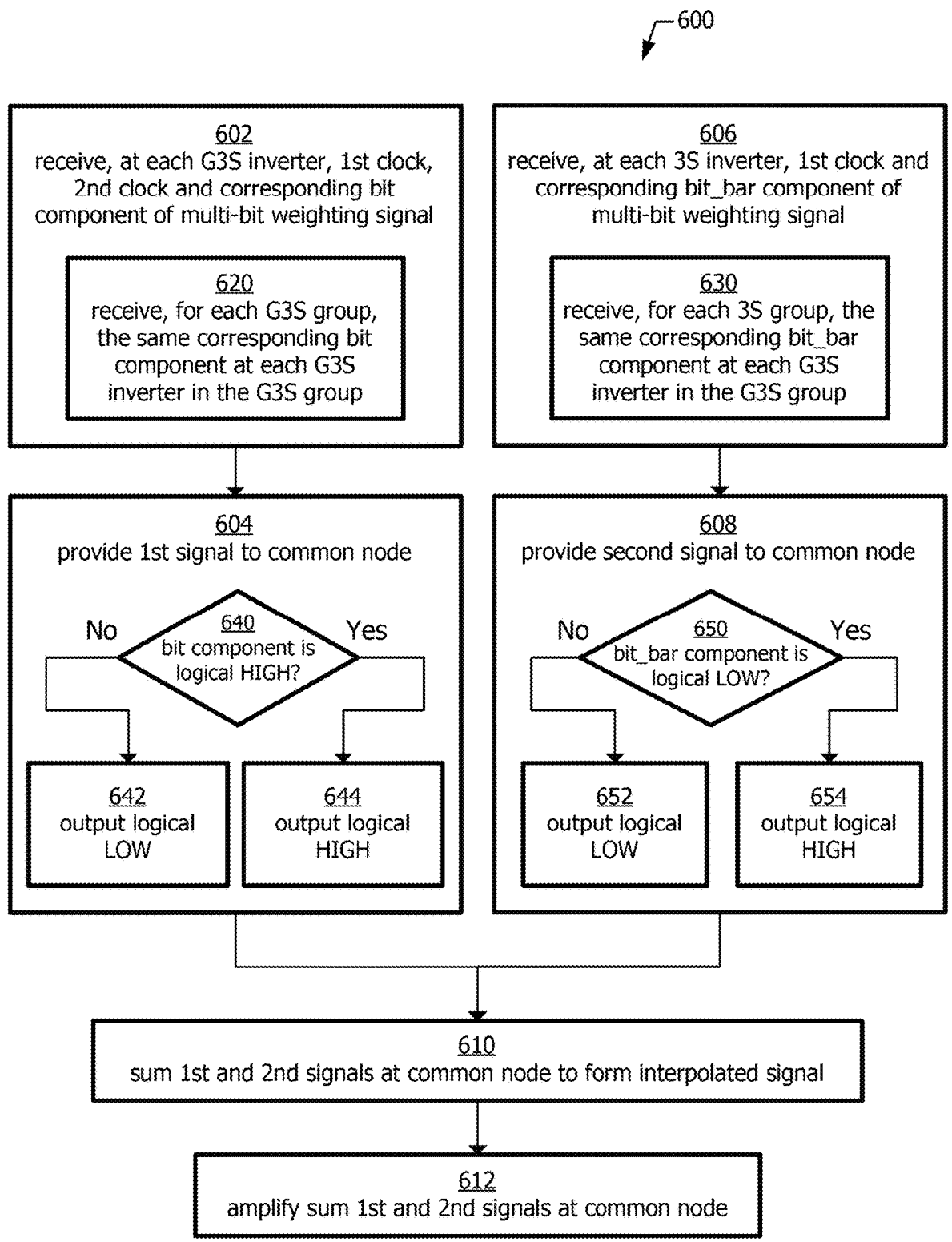
FIG. 6 is a flowchart of a method of operating a Phase-Interpolating system, in accordance with some embodiments.

FIG. 6 is a flowchart of a method 600 of operating a Phase-Interpolating (PI) system, in accordance with some embodiments.

An example of the PI system operated according to method 600 is PI system 202, which includes PI stage 204 and amplifying stage 206. An example of PI stage 204 is PI stage 304 of FIG. 3A, where PI stage 304 includes 3S inverters 310(1)-310(4) and G3S inverters 314(1)-314(4). An example of each of 3S inverters 310(1)-310(4) is 3S inverter 310(5)' of FIG. 3C'. An example of each of G3S inverters 314(1)-314(4) is G3S inverter 314(5)' of FIG. 3B'.

Method 600 includes blocks 602-612. Flow proceeds in parallel to each of blocks 602 and 606. Blocks 602-604 relate to the operation of the G3S inverters included in PI stage 304. At block 602, a first clock, a second clock signal and a corresponding bit component of a multi-bit weighting signal are received by each of the G3S inverters in the PI stage. Again, an example of the G3S inverters included in PI stage 304 is G3S inverter 314(5)' of FIG. 3B'. An example of the first clock signal is CLK1, wherein an inverted version (CLK1_bar) of CLK1 is received at the gating terminal G of G3S inverter 314(5)'. An example of the second clock signal is CLK2, wherein an inverted version (CLK2_bar) of CLK2 is received at the input terminal IN of G3S inverter 314(5)'. An example of the corresponding bit component of the multi-bit weighting signal is W<i>.

Block 602 includes block 620. At block 620, for each G3S group, the same corresponding bit component is received at each G3S inverter in the G3S group. An example of each G3S inverter in a given group receiving the same bit component is the eight instances of G3S inverter 314(4) in FIG. 3A that each receive W<3>. From block 620, flow exits block 602 and proceeds to block 604.

At block 604, each of the G3S inverters provides a corresponding first signal to a common node. An example of the common node is node 312 in FIG. 3A. Block 604 includes blocks 640-644.

At block 640, for each of the G3S inverters, a decision is made whether the corresponding bit component has a logical high state. If the answer at decision block 640 is no, then flow proceeds to block 642. At block 642, the corresponding G3S inverter is controlled to output a logical low signal. An example of controlling the G3S inverter to output a logical low signal is shown in FIG. 3E. If, however, the answer at decision block 640 is yes, then flow proceeds to block 644. At block 644, the corresponding G3S inverter is controlled to output a logical high signal. An example of controlling the G3S inverter to output a logical high signal is shown in FIG. 3G. From each of blocks 642 and 644, flow exits block 604 and proceeds to block 610.

Blocks 606-608 relate to the operation of the 3S inverters included in PI stage 304. Again, an example of the 3S inverters included in PI stage 304 is 3S inverter 310(5)' of FIG. 3C'.

At block 606, a first clock and a corresponding bit_bar component of the multi-bit weighting signal are received by each of the 3S inverters in the PI stage. Again, an example of the 3S inverters included in PI stage 304 is 3S inverter 310(5)' of FIG. 3C'. An example of the first clock signal is CLK1, wherein an inverted version (CLK1_bar) of CLK1 is received at the input terminal IN of 3S inverter 310(5)'. An example of the corresponding bit_bar component of the multi-bit weighting signal is W<i>_bar.

Block 606 includes block 630. At block 630, for each 3S group, the same corresponding bit_bar component is received at each 3S inverter in the 3S group. An example of each 3S inverter in a given group receiving the same bit_bar component is the eight instances of 3S inverter 310(4) in FIG. 3A that each receive W<3>. From block 630, flow exits block 606 and proceeds to block 608.

At block 608, each of the 3S inverters provides a corresponding second signal to the common node. Again, an example of the common node is node 312 in FIG. 3A. Block 608 includes blocks 650-654.

At block 650, for each of the 3S inverters, a decision is made whether the corresponding bit_bar component has a logical low state. If the answer at decision block 650 is no, then flow proceeds to block 652. At block 652, the corresponding 3S inverter is controlled to output a logical low signal. An example of controlling the 3S inverter to output a logical low signal is shown in each of FIG. 3E. If, however, the answer at decision block 650 is yes, then flow proceeds to block 654. At block 654, the corresponding 3S inverter is controlled to output a logical high signal. An example of controlling the 3S inverter to output a logical high signal is shown in FIG. 3G. From each of blocks 652 and 654, flow exits block 608 and proceeds to block 610.

At block 610, the first and second signals on the common node are summed to form an interpolated signal. Again, an example of the common node is node 312 in FIG. 3A. An example of summing the first and second signals on the common node to form an interpolated signal is shown in each of FIGS. 3F and 3G. From block 610, flow proceeds to block 612.

At block 612, the sum of the first and second signals (representing the interpolated signal) is amplified. An example of amplifying the sum of the first and second signals (representing the interpolated signal) is signal OUT2 at the output of inverting amplifier 409(1) in FIG. 4B, which is yet further amplified by inverting amplifier 409(2) to produce signal OUT5.

In an embodiment, a phase interpolating (PI) system includes: a PI stage configured to receive first and second clock signals and a multi-bit weighting signal, and generate an interpolated clock signal; and an amplifying stage configured to receive and amplify the interpolated clock signal, the amplifying stage including a capacitive component. The capacitive component is tunable to exhibit non-zero capacitances. The capacitive component has a Miller effect configuration resulting in a reduced footprint of the amplifying stage.

In some embodiments, the amplifying stage includes: an amplifier, an input of the amplifier being configured to receive an output of the PI stage, and an output of the amplifier representing an output of the amplifying stage; and the capacitive component is a feedback loop which couples the output of the amplifier to the input of the amplifier. In some embodiments, the feedback loop includes: a network of selectable, parallel connected capacitive paths coupled between the input and output of the amplifier. In some embodiments, the network of selectable, parallel connected capacitive paths includes: a switchable first capacitive path represents a first capacitance; a switchable second capacitive path represents a second capacitance; and a switchable third capacitive path represents a third capacitance; and wherein the first capacitance is less than the second capacitance; and the second capacitance is less than the third capacitance. In some embodiments, the first capacitance represents a unit value (x) of capacitance; the second capacitance represents a 2x value of capacitance; and the third capacitance represents a 4x value of capacitance.

In some embodiments, the PI stage is further configured to avoid a pull-up/pull-down (PUPD) short-circuit situation by using the multi-bit weighting signal and a logical inverse thereof (multi-bit weighting_bar signal). In some embodiments, the PI stage includes: a first cell including parallel connected gated tri-state (G3S) inverters; each of the G3S inverters being configured to receive the first clock signal, the second clock signal and a corresponding bit component of the multi-bit weighting signal, and to provide a corresponding signal on a common output node; and a second cell including parallel connected tri-state (3S) inverters; and each of the 3S inverters being configured to receive the first clock signal and a logical inverse of the corresponding bit component (corresponding bit_bar component) of the multi-bit weighting signal, and to provide a corresponding signal on the common output node. In some embodiments, each G3S inverter includes: first, second and third PMOS transistors and first, second and third NMOS transistors serially connected between a first reference voltage and second reference voltage; and wherein gate terminals of an alpha one of the first, second and third PMOS transistors and an alpha one of the first, second and third NMOS transistors are configured to receive an input signal of the G3S inverter; gate terminals of a beta one of the first, second and third PMOS transistors and a beta one of the first, second and third NMOS transistors are configured to receive a gating signal of the G3S inverter; and a gate terminal of a gamma one of the first, second and third NMOS transistors is configured to receive an enable signal; and a gate terminal of a gamma one of the first, second and third PMOS transistors is configured to receive an enable_bar signal. In some embodiments, the first PMOS transistor is coupled between the first reference voltage and a first node; the second PMOS transistor is coupled between the first node and a second node; the third PMOS transistor is coupled between the second node and a third node, the third node representing an output of the GS3 inverter; the first NMOS transistor is coupled between the third node and a fourth node; the second NMOS transistor is coupled between the fourth node and a fifth node; and the third NMOS transistor is coupled between the fifth node and the second reference voltage.

In some embodiments, each G3S inverter includes: an input terminal configured to receive the second clock signal; an output terminal coupled to a common node; an enable terminal configured to receive the corresponding bit component of the multi-bit weighting signal; and a gating terminal configured to receive the first clock signal; and each 3S inverter includes: an input terminal configured to receive the first clock signal; an output terminal coupled to the common node; and an enable terminal configured to receive the corresponding bit_bar component of the multi-bit weighting signal. In some embodiments, the G3S inverters in the first cell are organized into G3S groups; the 3S inverters in the second cell are organized into 3S groups which correspond to the G3S groups; for each G3S group, the G3S inverters included therein receive a same corresponding bit component of the multi-bit weighting signal; and for each 3S group, the 3S inverters included therein receive a same corresponding bit_bar component of the multi-bit weighting signal. In some embodiments, the G3S groups have different corresponding total numbers of G3S inverters included therein; for each G3S group, a total number of the G3S inverters included therein is a binary value represented by a bit_position of the corresponding bit component of the multi-bit weighting signal; and the 3S groups have different corresponding total numbers of 3S inverters included therein; and for each 3S group, a total number of the 3S inverters included therein is a binary value represented by a bit_position of the corresponding bit_component of the multi-bit weighting signal.

In some embodiments, a gated tri-state (G3S) inverter includes: first, second and third PMOS transistors and first, second and third NMOS transistors serially connected between a first reference voltage and second reference voltage; and wherein gate terminals of an alpha one of the first, second and third PMOS transistors and an alpha one of the first, second and third NMOS transistors are configured to receive an input signal of the G3S inverter; gate terminals of a beta one of the first, second and third PMOS transistors and a beta one of the first, second and third NMOS transistors are configured to receive a gating signal of the G3S inverter; and a gate terminal of a gamma one of the first, second and third NMOS transistors is configured to receive an enable signal; and a gate terminal of a gamma one of the first, second and third PMOS transistors is configured to receive an enable_bar signal.

In some embodiments, the first PMOS transistor is coupled between the first reference voltage and a first node; the second PMOS transistor is coupled between the first node and a second node; the third PMOS transistor is coupled between the second node and a third node, the third node representing an output of the GS3 inverter; the first NMOS transistor is coupled between the third node and a fourth node; the second NMOS transistor is coupled between the fourth node and a fifth node; and the third NMOS transistor is coupled between the fifth node and the second reference voltage. In some embodiments, the alpha one of the first, second and third PMOS transistors is the first PMOS transistor; the alpha one of the first, second and third NMOS transistors is the third NMOS transistor; the beta one of the first, second and third PMOS transistors is the second PMOS transistor; the beta one of the first, second and third NMOS transistors is the second NMOS transistor; the gamma one of the first, second and third PMOS transistors is the third PMOS transistor; and the gamma one of the first, second and third NMOS transistors is the first PMOS transistor.

In some embodiments, a method (of operating a gated tri-state (G3S) inverter) includes: receiving a gating signal, an enable signal and an input signal; when the enable signal has a first logical state, then generating a high impedance at an output of the G3S inverter; and when the enable signal has a second logical state: and also when each of the gating signal and the input signal has a first logical state, then generating a signal at the output of the G3S inverter which has a logical high state; or and also when each of the gating signal and the input signal has a second logical state, then generating a signal at the output of the G3S inverter which has a logical low state.

In some embodiments, the method further includes: when the enable signal has the logical high state, and also when the gating signal has the first logical state and the input signal has the second logical state, then generating the high impedance at the output of the G3S inverter. In some embodiments, the G3S inverter includes first, second and third PMOS transistors and first, second and third NMOS transistors serially connected between a first reference voltage and second reference voltage; and the method further includes: coupling the input signal to an alpha one of the first, second and third PMOS transistors and an alpha one of the first, second and third NMOS transistors; coupling the gating signal to gate terminals of a beta one of the first, second and third PMOS transistors and a beta one of the first, second and third NMOS transistors; and coupling the enable signal to a gate terminal of a gamma one of the first, second and third NMOS transistors; and coupling an enable_bar signal to a gate terminal of a gamma one of the first, second and third PMOS transistors. In some embodiments, the alpha one of the first, second and third PMOS transistors is the first PMOS transistor; the alpha one of the first, second and third NMOS transistors is the third NMOS transistor; the beta one of the first, second and third PMOS transistors is the second PMOS transistor; the beta one of the first, second and third NMOS transistors is the second NMOS transistor; the gamma one of the first, second and third PMOS transistors is the third PMOS transistor; and the gamma one of the first, second and third NMOS transistors is the first PMOS transistor. In some embodiments, the G3S inverter includes first, second and third PMOS transistors and first, second and third NMOS transistors serially connected between a first reference voltage and second reference voltage; and the first logical state is a low logical state.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A phase interpolating (PI) system comprising:
   a phase-interpolating (PI) stage configured to receive first and second clock signals and a multi-bit weighting signal, and generate an interpolated clock signal; and
   an amplifying stage configured to receive and amplify the interpolated clock signal, the amplifying stage including a capacitive component;
   the capacitive component being tunable to exhibit non-zero capacitances; and
   the capacitive component having a Miller effect configuration resulting in a reduced footprint of the amplifying stage.

2. The PI system of claim 1, wherein:
   the amplifying stage includes:
   an amplifier, an input of the amplifier being configured to receive an output of the PI stage, and an output of the amplifier representing an output of the amplifying stage; and
   the capacitive component is a feedback loop which couples the output of the amplifier to the input of the amplifier.

3. The PI system of claim 2, wherein the feedback loop includes:
   a network of selectable, parallel connected capacitive paths coupled between the input and output of the amplifier.

4. The PI system of claim 3, wherein the network of selectable, parallel connected capacitive paths includes:
   a switchable first capacitive path represents a first capacitance;
   a switchable second capacitive path represents a second capacitance; and
   a switchable third capacitive path represents a third capacitance; and
   wherein:
   the first capacitance is less than the second capacitance; and
   the second capacitance is less than the third capacitance.

5. The PI system of claim 4, wherein:
   the first capacitance represents a unit value (x) of capacitance;
   the second capacitance represents a 2x value of capacitance; and
   the third capacitance represents a 4x value of capacitance.

6. The PI system of claim 1, wherein:
the PI stage is further configured to avoid a pull-up/pull-down (PUPD) short-circuit situation by using the multi-bit weighting signal and a logical inverse thereof (multi-bit weighting_bar signal).

7. The PI system of claim 6, wherein the PI stage includes:
a first cell including parallel connected gated tri-state (G3S) inverters;
   each of the G3S inverters being configured to receive the first clock signal, the second clock signal and a corresponding bit component of the multi-bit weighting signal, and to provide a corresponding signal on a common output node; and
a second cell including parallel connected tri-state (3S) inverters; and
   each of the 3S inverters being configured to receive the first clock signal and a logical inverse of the corresponding bit component (corresponding bit_bar component) of the multi-bit weighting signal, and to provide a corresponding signal on the common output node.

8. The PI system of claim 7, wherein each G3S inverter includes:
first, second and third PMOS transistors and first, second and third NMOS transistors serially connected between a first reference voltage and second reference voltage; and
wherein:
   gate terminals of an alpha one of the first, second and third PMOS transistors and an alpha one of the first, second and third NMOS transistors are configured to receive an input signal of the G3S inverter;
   gate terminals of a beta one of the first, second and third PMOS transistors and a beta one of the first, second and third NMOS transistors are configured to receive a gating signal of the G3S inverter;
   a gate terminal of a gamma one of the first, second and third NMOS transistors is configured to receive an enable signal; and
   a gate terminal of a gamma one of the first, second and third PMOS transistors is configured to receive an enable_bar signal.

9. The PI system of claim 8, wherein:
the first PMOS transistor is coupled between the first reference voltage and a first node;
the second PMOS transistor is coupled between the first node and a second node;
the third PMOS transistor is coupled between the second node and a third node, the third node representing an output of the GS3 inverter;
the first NMOS transistor is coupled between the third node and a fourth node;
the second NMOS transistor is coupled between the fourth node and a fifth node; and
the third NMOS transistor is coupled between the fifth node and the second reference voltage.

10. The PI system of claim 7, wherein:
each G3S inverter includes:
   an input terminal configured to receive the second clock signal;
   an output terminal coupled to a common node;
   an enable terminal configured to receive the corresponding bit component of the multi-bit weighting signal; and
   a gating terminal configured to receive the first clock signal; and
each 3S inverter includes:
   an input terminal configured to receive the first clock signal;
   an output terminal coupled to the common node; and
   an enable terminal configured to receive the corresponding bit_bar component of the multi-bit weighting signal.

11. The PI system of claim 7, wherein:
the G3S inverters in the first cell are organized into G3S groups;
the 3S inverters in the second cell are organized into 3S groups which correspond to the G3S groups;
for each G3S group, the G3S inverters included therein receive a same corresponding bit component of the multi-bit weighting signal; and
for each 3S group, the 3S inverters included therein receive a same corresponding bit_bar component of the multi-bit weighting signal.

12. The PI system of claim 11, wherein:
the G3S groups have different corresponding total numbers of G3S inverters included therein;
for each G3S group, a total number of the G3S inverters included therein is a binary value represented by a bit position of the corresponding bit component of the multi-bit weighting signal; and
the 3S groups have different corresponding total numbers of 3S inverters included therein; and
for each 3S group, a total number of the 3S inverters included therein is a binary value represented by a bit position of the corresponding bit_bar component of the multi-bit weighting signal.

13. A phase interpolating (PI) system comprising:
a phase-interpolating (PI) stage configured to receive first and second clock signals and a multi-bit weighting signal, and generate an interpolated clock signal; and
an amplifying stage configured to receive and amplify the interpolated clock signal, the amplifying stage including:
   an amplifier, an input of the amplifier being configured to receive an output of the PI stage, and an output of the amplifier representing an output of the amplifying stage; and
   a network of selectable, parallel connected capacitive paths coupled in a feedback arrangement between the input and output of the amplifier, the network representing a capacitive component that couples the output of the amplifier to the input of the amplifier;
   the network being tunable to exhibit non-zero capacitances;
   the network having a Miller effect configuration resulting in a reduced footprint of the amplifying stage; and
the network of selectable, parallel connected capacitive paths including:
   a switchable first capacitive path represents a first capacitance;
   a switchable second capacitive path represents a second capacitance; and
   a switchable third capacitive path represents a third capacitance;
      the first capacitance being less than the second capacitance; and
      the second capacitance being less than the third capacitance.

14. The PI system of claim 13, wherein:
the first capacitance represents a unit value (x) of capacitance;

the second capacitance represents a 2x value of capacitance; and the third capacitance represents a 4x value of capacitance.

15. A phase interpolating (PI) system comprising:

a phase-interpolating (PI) stage configured to receive first and second clock signals and a multi-bit weighting signal, and generate an interpolated clock signal; and an amplifying stage configured to receive and amplify the interpolated clock signal, the amplifying stage including a capacitive component;

the capacitive component being tunable to exhibit non-zero capacitances; and the capacitive component having a Miller effect configuration resulting in a reduced footprint of the amplifying stage; and the PI stage further being configured to avoid a pull-up/pull-down (PUPD) short-circuit situation by using the multi-bit weighting signal and a logical inverse thereof (multi-bit weighting_bar signal).

16. The PI system of claim 15, wherein the PI stage includes:

a first cell including parallel connected gated tri-state (G3S) inverters;

each of the G3S inverters being configured to receive the first clock signal, the second clock signal and a corresponding bit component of the multi-bit weighting signal, and to provide a corresponding signal on a common output node; and a second cell including parallel connected tri-state (3S) inverters; and each of the 3S inverters being configured to receive the first clock signal and a logical inverse of the corresponding bit component (corresponding bit_bar component) of the multi-bit weighting signal, and to provide a corresponding signal on the common output node.

17. The PI system of claim 16, wherein:

each G3S inverter includes:

an input terminal configured to receive the second clock signal;

an output terminal coupled to a common node;

an enable terminal configured to receive the corresponding bit component of the multi-bit weighting signal; and a gating terminal configured to receive the first clock signal; and each 3S inverter includes:

an input terminal configured to receive the first clock signal;

an output terminal coupled to the common node; and an enable terminal configured to receive the corresponding bit_bar component of the multi-bit weighting signal.

18. The PI system of claim 16, wherein:

the G3S inverters in the first cell are organized into G3S groups;

the 3S inverters in the second cell are organized into 3S groups which correspond to the G3S groups;

for each G3S group, the G3S inverters included therein receive a same corresponding bit component of the multi-bit weighting signal; and for each 3S group, the 3S inverters included therein receive a same corresponding bit_bar component of the multi-bit weighting signal.

19. The PI system of claim 18, wherein:

the G3S groups have different corresponding total numbers of G3S inverters included therein;

for each G3S group, a total number of the G3S inverters included therein is a binary value represented by a bit position of the corresponding bit component of the multi-bit weighting signal; and the 3S groups have different corresponding total numbers of 3S inverters included therein; and for each 3S group, a total number of the 3S inverters included therein is a binary value represented by a bit position of the corresponding bit_bar component of the multi-bit weighting signal.

* * * * *